(12) United States Patent
Ouyang et al.

(10) Patent No.: US 7,672,129 B1
(45) Date of Patent: Mar. 2, 2010

(54) INTELLIGENT MICROCHANNEL COOLING

(75) Inventors: Chien Ouyang, San Jose, CA (US);
Kenneth C. Gross, San Diego, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 446 days.

(21) Appl. No.: 11/523,435

(22) Filed: Sep. 19, 2006

(51) Int. Cl.
*H05K 7/20* (2006.01)
*H01L 23/34* (2006.01)
*F28F 7/00* (2006.01)
*H02K 44/08* (2006.01)

(52) U.S. Cl. .................. 361/699; 361/703; 257/714; 165/80.4; 165/80.5; 165/104.33; 174/15.1; 417/50

(58) Field of Classification Search .......... 361/698, 361/699, 701–705; 257/714; 165/80.4–80.5, 165/104.33; 174/15.1, 15.2, 252; 417/50
See application file for complete search history.

(56) References Cited

U.S. PATENT DOCUMENTS

| | | | |
|---|---|---|---|
| 4,791,548 A * | 12/1988 | Yoshikawa et al. | 700/29 |
| 5,032,897 A | 7/1991 | Mansuria et al. | |
| 5,099,910 A | 3/1992 | Walpole et al. | |
| 5,195,102 A | 3/1993 | McLean et al. | |
| 5,220,171 A | 6/1993 | Hara et al. | |
| 5,355,942 A | 10/1994 | Conte | |
| 5,724,818 A | 3/1998 | Iwata et al. | |
| 5,727,618 A | 3/1998 | Mundinger et al. | |
| 5,918,469 A | 7/1999 | Cardella | |
| 5,921,087 A | 7/1999 | Bhatia et al. | |
| 5,960,866 A | 10/1999 | Kimura et al. | |
| 6,094,919 A | 8/2000 | Bhatia et al. | |
| 6,233,959 B1 | 5/2001 | Kang et al. | |
| 6,233,960 B1 | 5/2001 | Kang et al. | |
| 6,250,085 B1 | 6/2001 | Tousson | |
| 6,338,251 B1 | 1/2002 | Ghoshal et al. | |
| 6,424,533 B1 | 7/2002 | Chu et al. | |
| 6,453,678 B1 | 9/2002 | Sundhar | |
| 6,463,743 B1 | 10/2002 | Laliberte | |
| 6,512,291 B2 | 1/2003 | Dautartas et al. | |

(Continued)

FOREIGN PATENT DOCUMENTS

JP 1995407202094 2/1997

OTHER PUBLICATIONS

"TEC Integrated Heat Sinks", Enertron Custom Design & Manufacturing of Thermal Management System; Enertron, Inc., Mesa, AZ., 2002, 1 pg.

(Continued)

*Primary Examiner*—Zachary M Pape
(74) *Attorney, Agent, or Firm*—Meyertons, Hood, Kivlin, Kowert & Goetzel, P.C.; B. Noel Kivlin

(57) ABSTRACT

A cooling system for a heat producing component includes a base having two or more cells. The cells may include microchannel passages. A pump system may be coupled to the base. The pump system may circulate fluid independently in each of two or more of the cells. The pump system may include an array of two more magnetohydrodynamic pumps. Each magnetohydrodynamic pump may provide fluid to a different cell. A controller may control a flow rate in each one of cell of the cooling system independently one or more of other cells of the cooling system.

16 Claims, 10 Drawing Sheets

U.S. PATENT DOCUMENTS

| | | | |
|---|---|---|---|
| 6,559,538 | B1 | 5/2003 | Pomerene et al. |
| 6,581,388 | B2 | 6/2003 | Novotny et al. |
| 6,645,786 | B2 | 11/2003 | Pomerene et al. |
| 6,658,861 | B1 | 12/2003 | Ghoshal et al. |
| 6,708,501 | B1 | 3/2004 | Ghoshal et al. |
| 6,711,904 | B1 | 3/2004 | Law et al. |
| 6,743,972 | B2 | 6/2004 | Macris |
| 6,903,929 | B2 | 6/2005 | Prasher et al. |
| 6,917,522 | B1 | 7/2005 | Erturk |
| 6,950,773 | B1 | 9/2005 | Gross et al. |
| 6,989,134 | B2 | 1/2006 | Tonkovich et al. |
| 7,002,801 | B2 | 2/2006 | Zeighami et al. |
| 7,020,802 | B2 | 3/2006 | Gross et al. |
| 7,058,101 | B2 | 6/2006 | Treusch et al. |
| 7,076,389 | B1 | 7/2006 | Gross et al. |
| 7,085,681 | B1 | 8/2006 | Williams et al. |
| 7,342,787 | B1 | 3/2008 | Bhatia |
| 2003/0085024 | A1 | 5/2003 | Santiago et al. |
| 2003/0235504 | A1* | 12/2003 | Lemoff et al. ................. 417/50 |
| 2004/0112585 | A1* | 6/2004 | Goodson et al. ............ 165/299 |
| 2004/0182088 | A1 | 9/2004 | Ghoshal et al. |
| 2004/0234379 | A1 | 11/2004 | Miner et al. |
| 2004/0234392 | A1 | 11/2004 | Ghoshal et al. |
| 2004/0251539 | A1 | 12/2004 | Faris et al. |
| 2005/0087767 | A1 | 4/2005 | Fitzgerald et al. |
| 2005/0139345 | A1* | 6/2005 | Pokharna et al. ........... 165/80.4 |
| 2005/0150535 | A1 | 7/2005 | Samavedam et al. |
| 2005/0150536 | A1 | 7/2005 | Ngai et al. |
| 2005/0150537 | A1 | 7/2005 | Ghoshal |
| 2005/0150539 | A1 | 7/2005 | Ghoshal et al. |
| 2005/0160752 | A1 | 7/2005 | Ghoshal et al. |
| 2005/0189089 | A1 | 9/2005 | Miner |
| 2005/0205241 | A1 | 9/2005 | Goodson et al. |
| 2005/0211417 | A1* | 9/2005 | Upadhya et al. ........... 165/80.4 |
| 2006/0073024 | A1* | 4/2006 | Ghoshal et al. ............... 417/50 |
| 2007/0235180 | A1 | 10/2007 | Ouyang |

OTHER PUBLICATIONS

"Laser Module cooling, Design Goals and Constraints", Enertron Total Thermal Management Solutions, Enertron, Inc., Mesa, AZ, 2002, 1 pg.

Garner, Scott D., "Heat pipes for electronics cooling applications" Electronics Cooling, Thermacore, Inc., Lancaster, PA., 2001, 10pgs.

"subZero4G Thermo-Electric Cooling", Thermaltake SubZero4G Thermo-Electric Cooling, Thermaltake Technology Co., Ltd., City of Industry, CA., 2003, 6 pgs.

"The Cooligy Electrokinetic Pump", http://web.archive.org/web/20040630060103/www.cooligy.com/electrokinetic_pump.html, dated Jul. 25, 2004, 2 pgs.

"Advanced Microchannel Cooling Loop", http://web.archive.org/web/20040725041209/www.cooligy.com/microchannels.html, dated Jul. 25, 2004, 4 pgs.

"Microchannel Cooling", http://web.archive.org/web/20040619033221/www.cooligy.com/microchannels.html, dated Jul. 25, 2004, 3 pgs.

Dallas Semiconductor Maxim "MAX6657, MAX6658, MAX6659" Overview: + 1°C, SMBus-Compatible Remote/Local Temperature Sensors with Overtemperature Alarms, Maxim Integrated Products, 2006 (2 pgs.).

Co-pending U.S. Appl. No. 11/601,527, "Thermoelectric Cooling Device Arrays", to Ouyang, filed Nov. 17, 2006.

Hughes, Ronnie D. "Remote Diodes Yield Accurate Temperature Measurements", National Semiconductor, Jul. 10, 2003, Located on Manufacturing.net at http://www.manufacturing.net/article/CA307863?ticker-NSM on Feb. 1, 2004 (4 pgs.).

Snyder, G. Jeffrey, et al. "Hot Spot Cooling Using Embedded Thermoelectric Coolers", Nextreme Thermal Solutions, Research Triangle Park, NC, 22nd IEEE Semi-Therm Symposium, 2006 (9 pgs. beginning on p. 135).

Thermocore Thermal Management Solutions, Advanced Cooling Solutions for a Changing World, Electronics Cooling Group of Modine Applied Thermal Innovation, Modine Manufacturing Company, 2005 (12 pgs).

Venkatasubramanlan, Rama, et al. "Thin-Film Thermoelectric Devices with High Room-Temperature Figures of Merit", Macmillan Magazines Ltd, Nature, vol. 413, Oct. 11, 2001, www.nature.com, Research Triangle Institute, Research Triangle Park, NC (pp. 597-602).

Moore, Bruce D. "IC Temperature Sensors Find the Hot Spots," Maxim Integrated Products, www.edmag.com, EDN Jul. 2, 1998, Sunnyvale, CA (pp. 99-110).

Maxim "+ 1°C, SMBus-Compatible Remote/Local Temperature Sensors with Overtemperature Alarms", Maxim Integrated Products, Sunnyvale, CA MAX6657/MAX6658/MAX6659, www.maxim-ic.com, Rev. 4; 5/06 (pp. 1-17).

\* cited by examiner

INTELLIGENT MICROCHANNEL COOLING

BACKGROUND OF THE INVENTION

1. Field of the Invention

This invention relates generally electronic equipment, such as computers, and, more particularly, to apparatus and methods for cooling electronic devices using circulating fluids.

2. Background Information

Computer systems often require high reliability and high capacity of operation. Various approaches have been taken to providing such high-performance, high reliability systems. High density systems are typically rack mountable, with one or more processor modules occupying a prescribed space (e.g., a vertical slot) in the rack. A trend in recent times is to make the computers with smaller form factors. This means that more processors can be located in a rack. This has the advantage of increasing the processing density within the racks, and also the advantage of reducing the distance between the computer systems.

Components of computer systems may generate substantial amounts of heat during operation. Higher operating temperatures in electronic components are associated with decreased reliability of the components. To address this issue, some systems include fans or blowers to force air over the heat-generating components to cool the components.

Heat sinks may be attached to components to facilitate heat dissipation from the components. A heat sink is typically made of a thermally conductive material, such as aluminum, with a plurality of fins or pins on an exposed side of the heat sink. Heat is dissipated from the fins or pins to the surrounding air principally by thermal convection.

Some cooling systems use forced convection of fluids to carry heat from heat producing components such as microprocessors. One such system is a microchannel system. In a typical microchannel system, fluid is directed through a multitude of small channels in proximity with a heat producing component. A large number of microchannels may provide a large amount of surface area that facilitates cooling of the heat producing component. The fluid is carried away from the channels and through a pipe to a heat sink, where the heat can be rejected to the surroundings.

In a typical cooling system, a constant flow of fluid may be delivered at all times, to all impinging surfaces, of the heat producing component. In reality, however, the surface of the heat producing component will have significant temporal and spatial thermal variations. A cooling solution is desired that more effectively provisions cooling fluid when and where it is most needed.

SUMMARY OF THE INVENTION

Various embodiments of systems and methods of cooling electronic devices are described. In an embodiment, a cooling system for a heat producing component includes a base having two or more cells. The cells may include microchannel passages. A pump system may be coupled to the base. The pump system may circulate fluid independently in each of two or more of the cells. In some embodiments, the base is part of a package for the heat producing component. In certain embodiments, a base is coupled to an integrated circuit package. At least two cells on the base may each cool a different region of the integrated circuit package.

In some embodiments, a cooling system includes two or more magnetohydrodynamic pumps. The cooling system includes two or more cells coupled to a heat producing component. Each of the magnetohydrodynamic pumps provides fluid to a different cell. The cells may include microchannel passages. In some embodiments, the size the microchannel passages in one or more of the cells of may be different than a size of the microchannel passages of other cells.

In some embodiments, a controller is coupled to a pump system for a cooling device. The controller may control a flow rate in each one of cell of the cooling device independently one or more of other cells of the cooling device. Temperature sensors may be coupled to a base of the cooling device and the controller. The controller may receive information from the at least one temperature sensor for use in controlling the flow rate in one or more of the cells. In one embodiment, the controller is a discrete time, multiple input, multiple output controller.

In an embodiment, a cooling system for a heat producing component includes a base having microchannel passages. The base couples with an electronic device. One or more magnetohydrodynamic pumps are coupled to the base. The magnetohydrodynamic pumps provision fluid to the microchannel passages.

In one embodiment, a magnetohydrodynamic pump includes an electrically non-conductive tube segment including a pump passage and an opposing pair of electrodes. Each electrode may pass through a wall of the tube segment. The pump system may include magnets that produce a magnetic field in the pump passage. In some embodiments, a pump system includes a shielding member that surrounds an array of pumps in the pump system.

In an embodiment, a cooling plate includes two or more sections. Each section may include a set of microchannels, an inlet, and an outlet. The width of some or all of the microchannels for each section may be different from the width of the microchannels of the other sections. In certain embodiments, a width of the first section is different from a width of the second section. In certain embodiments, the microchannels in different sections are substantially parallel to one another.

In an embodiment, a cooling plate includes three or more sections (e.g., an N×M array of cells). The sections may be arranged such that a rate of cooling can be independently adjusted in at least two directions (e.g., an x direction and a y direction) on the cooling plate. In some embodiments, a first pump system is coupled to a set of microchannels in a first section and a second pump system is coupled to a second set of microchannels in a second section. The first pump system may pump a fluid through a set of microchannels in the first section at a first flow rate. The second pump system may pump fluid through the second section at a second flow rate that is different from the first flow rate.

BRIEF DESCRIPTION OF THE DRAWINGS

Other aspects of the invention will become apparent upon reading the following detailed description and upon reference to the accompanying drawings in which.

Figure 1:
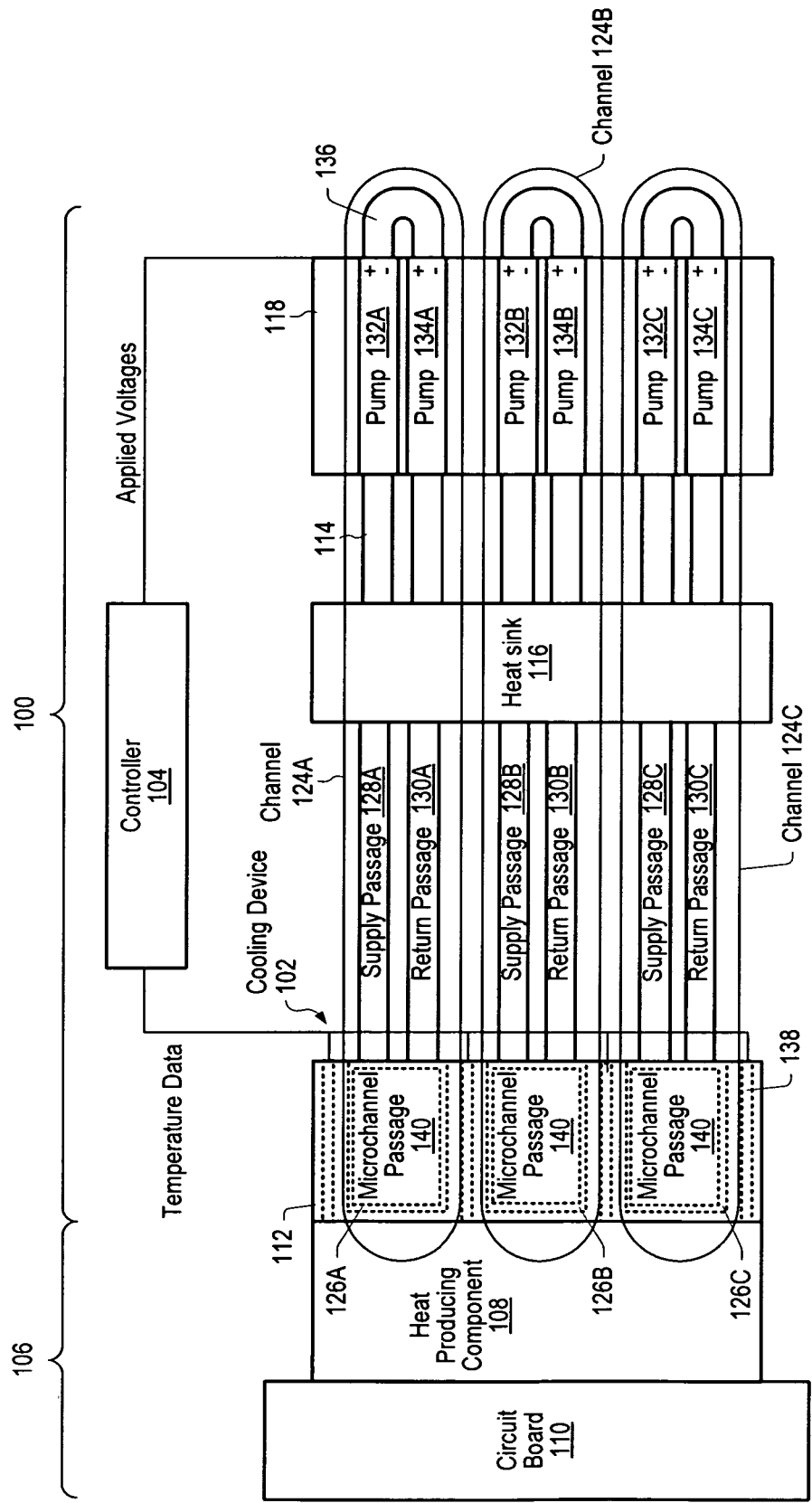
FIG. 1 is a block diagram of a cooling system including a multi-channel cooling device and a controller according to one embodiment.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

The following description generally relates to devices for cooling computer system components such as microprocessors. Such systems and methods may be used in a variety of applications. A non-exhaustive list of such applications includes: telecommunications network server systems; e-commerce web server systems; LAN application and file server systems; personal computer systems; and remote vehicle control systems.

As used herein, "module" includes any modular unit or subsystem. Examples of a module include, but are not limited to, a memory module, a printed circuit board assembly, an information processing cartridge, a power supply, or a combination thereof. In certain embodiments, a module may include multiple circuit boards (e.g., a mezzanine card mounted to a main circuit board). Modules may be various shapes, including, but not limited to, rectangular, triangular, or an irregular shape. In certain embodiments, components of a module may be housed in an enclosure. Sides of an enclosure for a module may include perforations or other openings to allow for a flow of cooling air through the enclosure.

As used herein, "circuit board" includes any circuit module that carries one or more other circuit modules or components. "Circuit board" includes, but is not limited to, a printed circuit board made of epoxy-glass and metal layers. As used herein, "component" includes any element of system, including, but not limited to, a printed circuit board, a semiconductor device, a resistor, or a capacitor, a power supply, or a disk drive.

As used herein, "enclosure" includes any structure that houses one or more elements of a computer system (e.g., electronic modules).

As used herein, "coupled" includes a direct coupling or an indirect coupling (e.g., with one or more intervening elements) unless expressly stated otherwise. For example, a heat sink may be coupled to a socket by directly attaching the heat sink to the socket, or by connecting the heat sink and the socket to one or more intervening elements (e.g., a bracket, a printed circuit board).

As used herein, "pipe" includes any tube or elongated member having a hollow portion. A pipe may have one hollow passage or more than one hollow passage. Suitable cross sections for a pipe include, circular, square, rectangular, regular or irregular cross section. A cross section of a pipe may change over the length of the pipe.

FIG. 1 depicts a cooling system for a circuit module according to one embodiment. Cooling system 100 includes cooling device 102 and controller 104. Cooling device 102 is coupled to circuit module 106. Circuit module 106 includes heat producing component 108. Heat producing component 108 is mounted on circuit board 110. Examples of heat producing components include microprocessors such as a central processing unit, an application specific integrated circuits (ASIC), memory chips, and disk drives. Cooling device 102 may provide cooling of heat producing component 108 during operation of circuit module 106. In some embodiments, a cooling device may couple to and cool multiple heat producing components, such as a row of integrated circuit packages mounted on a common circuit board.

Cooling device 102 includes base 112, pipes 114, and heat sink 116, and pump system 118. Pump system 118 may include an array of pumps. In some embodiments, pumps may be magnetohydrodynamic pumps. As used herein, "magnetohydrodynamic pump", or "MHD pump", includes any pump that applies a voltage to a fluid in a magnetic field to produce motion in the fluid. Examples of other suitable pumps may include peristaltic pumps, rotary pumps, electrokinetic pumps, and membrane pumps.

Cooling device 102 includes two or more cooling channels 124. Each cooling channel 124 includes cell 126, supply passage 128, return passage 130, and pump 132 and 134. In FIG. 1, each of channels 124 and their respective components are designated with a different letter suffix (A, B, or C) for clarity. Some or all of passages 128 and/or return passages 130 may pass through, or be coupled to, heat sink 116. Fluid returning in return passages 130 may be recirculated into supply passages 128 by way of return loops 136. In certain embodiments, channels may include one or more reservoirs. For example, return loops 136 may be pass through and be in fluid communication with a common reservoir from which cooling fluid is drawn into pumps 132. As used herein, "reservoir" includes any element that holds a volume of fluid. In some embodiments, cooling liquids from all the cooling channels pass through a common reservoir. In certain embodiments, two or more separate reservoirs may be provided for channels of a cooling system.

Base 112 may have various sizes, shapes, and constructions. Although base 112 is depicted as a separate element in FIG. 1, it should be understood that a base in some embodiments may be integral to one or more heat producing components. For example, microchannels may be etched, micromachined, or electroformed in a top surface of a semiconductor package. In some embodiments, base 112 may be produced as a separate component from a package for a heat producing component, then coupled to the package by an adhesive, solder, brazing, or other suitable technique. In still other embodiments, a base may be pre-assembled with other elements of a cooling device (e.g., a cover, pipes), which elements may be installed as an assembly onto a heat producing component. In one embodiment, a thermal interface material (e.g., a thermal epoxy, thermal grease, a phase change material) may be provided between a heat producing component and a base.

Cooling device 102 may include temperature sensors 138. Controller 104 is coupled to temperature sensors 138. Controller 104 may receive signals representative of temperatures in base 112 or heat producing component 108. In some embodiments, controller may receive temperature data from a temperature sensor in, or coupled to, heat producing component 108. Controller 104 is coupled to pumps 132 and 134. Controller 104 may apply voltages to pumps 132 and 134 to regulate flow in channels 124. In a preferred embodiment, the controller is a discrete time, multiple input, multiple output (MIMO) controller. Controller 104 may be operated according to a feedback and control algorithm that optimizes fluid flow rates in the channels.

Although pumps 132 and 134 in FIG. 1 are shown on the opposite side of heat sink 116 from base 112, pumps may in some embodiments be placed in different positions in a cooling system. For example, with respect to the example shown in FIG. 1, pumps 132 and/or 134 might be located between heat sink 116 and base 108. In some embodiments, a channel may include a pump between a heat sink and a base and another pump on the opposite side of the heat sink from a base. In certain embodiments, pumps may be partially or completely embedded in a heat sink. A channel may include more than two pumps or only a single pump. For example, in one embodiment, pumps 134A, 134B, and 134C may be omitted, with pumps 132A, 132B, and 132C providing all of the pumping capacity for channels 124A, 124B, and 124C, respectively.

Each of cells 126 may include one or more microchannel passages 140. Microchannel passages may promote transfer of heat from heat producing component 108 to fluid in cells 126. As used herein, a "microchannel passage" includes any passage that has one or more microchannels. As used herein, a "microchannel" includes any small channel having a width that is less than its height. In one embodiment, microchannel is about 10 microns. In another embodiment, a microchannel is less than about 100 microns. In another embodiment, a microchannel is less than about 200 microns. In another embodiment, a microchannel is between about 15 and about 185 microns. In still another embodiment, a microchannel is about 200 to about 300 microns. Microchannel passages may have various patterns. In certain embodiments, microchannel dimensions are such that heat cooling occurs without little or no turbulence in the channels. Microchannel dimensions may be selected to provide a desired level of cooling without any turbulence. Nevertheless, microchannels may in certain embodiments allow for some turbulence in the microchannels.

Microchannel passages may have a single segment or more than one segment. Passages may be continuous or have regular or irregular breaks. Examples of paths for a microchannel include straight, curved, arcuate, s-shaped, u-shaped, serpentine, radial, spiral, labyrinthine, or a combination thereof.

Figure 2:
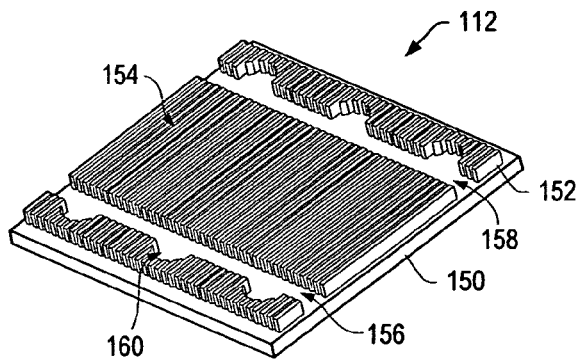
FIG. 2 depicts a base for a cooling device including microchannels according to one embodiment.
Figure 3:
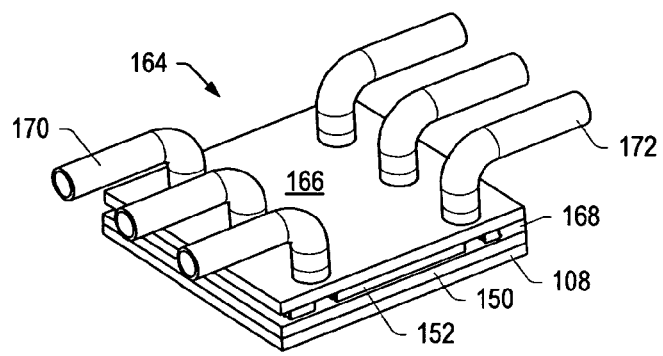
FIG. 3 depicts a cooling plate assembly including a microchannel base according to one embodiment.

FIG. 2 depicts a base for a cooling device including microchannels according to one embodiment. FIG. 3 depicts a cooling plate assembly including a microchannel base as shown in FIG. 2, mounted on a heat producing component, according to one embodiment. As shown in FIG. 2, base 112 includes base plate 150. Walls 152 extend from base plate 150. Adjacent walls 152 may define microchannels 154. Base 112 includes inlet port 156 and outlet port 158. Inlet port 156 and outlet port 158 may include scallops 160. Scallops 160 may facilitate flow of fluid into inlet port 156 and out of outlet port 158. As discussed above, base 112 may in certain embodiments be integrally formed with, or permanently coupled to, heat producing component 108.

Turning to FIG. 3, cooling plate assembly 164 includes base 112, cover 166, and peripheral ring 168. Peripheral ring 168 extends around the perimeter of walls 152 between base 112 and cover 166. In some embodiments, base 112 and/or cover 166 may include peripheral walls to enclose walls 152 and peripheral ring 168 may be omitted.

Inlet pipes 170 and outlet pipes 172 are attached to cover 166. During operation, fluid may be introduced through inlet pipes 170 into inlet port 156. Fluid may be forced through microchannels 154 to outlet port 158. Fluid may be forced out of outlet port 158 into outlet pipes 172. Flow may be produced by positive pressure in inlet pipes 170, by a negative pressure in outlet pipes 172 (e.g., by drawing a vacuum downstream from outlet pipes 172), or a combination thereof.

In the embodiment shown in FIG. 2, inlet port 156 and outlet port 158 run the full width of base 112 (e.g., perpendicular to the flow through microchannels 154). Nevertheless, in certain embodiments, a pattern of microchannels may include partitioning between channels. For example, inlet port 156 may be partitioned between adjacent inlet pipes 170 and outlet port 158 may be partitioned between corresponding adjacent outlet pipes 172 such that fluid flow is separated into channels (e.g., one channel for each pair of inlet/outlet pipes).

Figure 4:
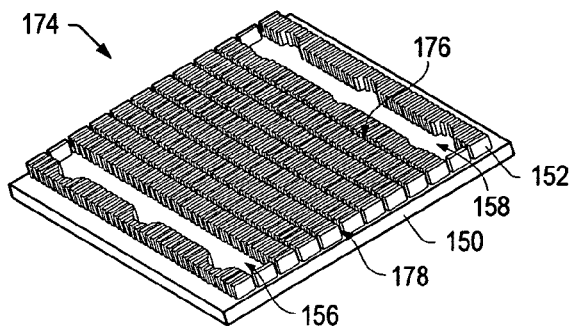
FIG. 4 depicts a base for a cooling device including microchannels with breaks according to one embodiment.
Figure 5:
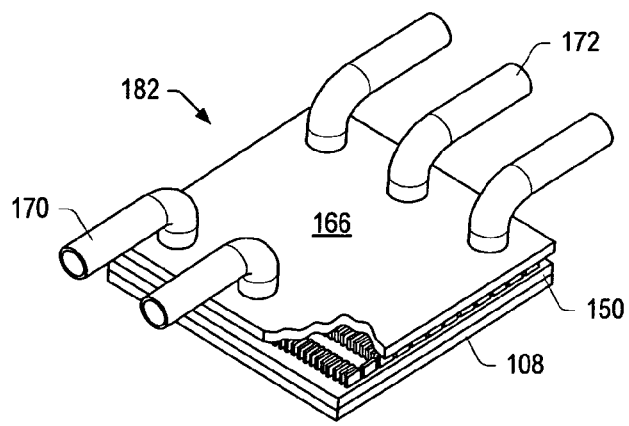
FIG. 5 depicts a cooling plate assembly including a microchannel base with breaks according to one embodiment.

Fluid in a cooling device may mix among microchannels or not mix among microchannels. FIG. 4 depicts a base for a cooling device including microchannels with breaks according to one embodiment. FIG. 5 depicts a cooling plate assembly including a microchannel base as shown in FIG. 4, mounted on a heat producing component, according to one embodiment. Base 174 includes base plate 150 and walls 152. Walls 152 may define microchannels 176. Walls 152 may include breaks 158. Although breaks 158 shown in FIG. 4 are shown at regular spacing intervals, channels may have other arrangements, such as irregularly spaced breaks, staggered breaks, or a combination thereof.

Turning to FIG. 5, cooling plate assembly 182 includes base 174 and cover 166. A peripheral ring (such as peripheral ring 168 shown in FIG. 3) may be included to enclose microchannels 176. Breaks 158 may allow cross migration of fluids between microchannels 176. Cross migration may reduce transverse and gradients in base 174.

In some embodiments, different sections of a cooling device may have different dimensions. For example, one section of a cooling device may have microchannels that are narrower than the microchannels of another section. As another example, the microchannels in one section of a cooling device may have a different pitch that the microchannels of another section. As still another example, one section of a cooling device may have different overall dimensions (e.g., a height of the section, a width of the section, a total cross sectional area of the microchannels in a section) than those of another section. Different sections of a cooling device may provide different cooling capacities for a given flow rate through the section.

Figure 6:
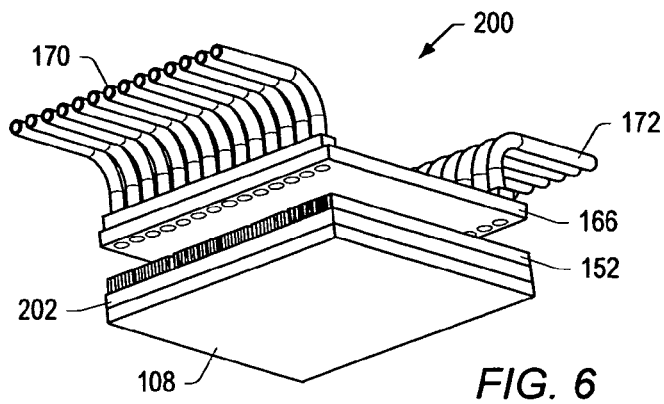
FIG. 6 depicts a cooling plate assembly with multiple sections according to one embodiment.
Figure 7:
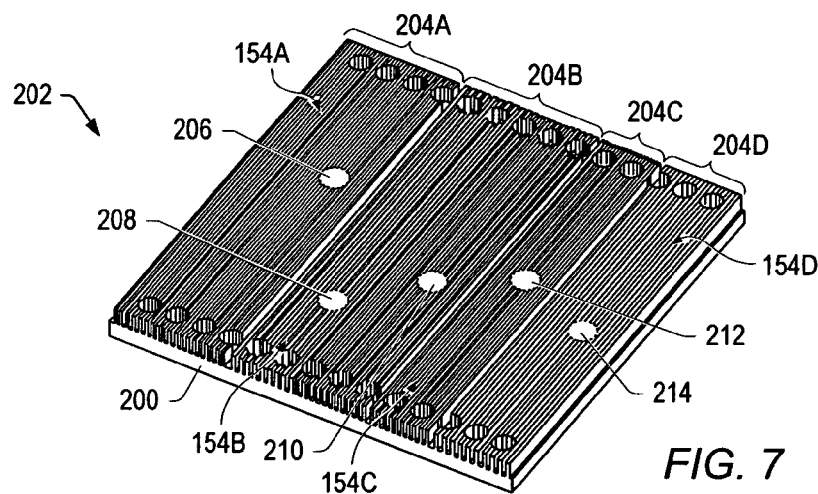
FIG. 7 depicts a base for a cooling device having multiple sections according to one embodiment.
Figure 8:
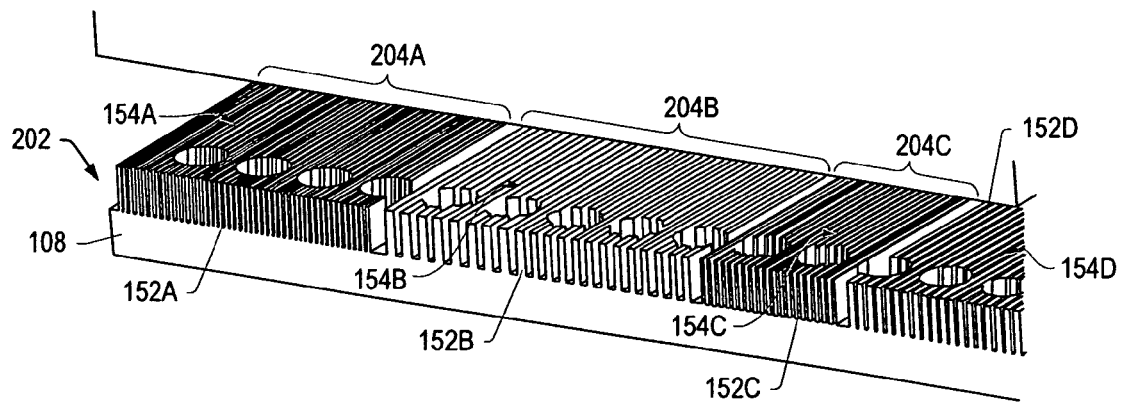
FIG. 8 is a detail view of a base for a cooling device having multiple sections according to one embodiment.

FIGS. 6-8 depict a cooling plate assembly having multiple sections according to one embodiment. FIG. 6 depicts cooling plate assembly 200 on heat producing component 108 (cooling plate assembly 200 is partially exploded for clarity). Cooling plate assembly 200 includes base 202 and cover 166. Inlet pipes 170 and outlet pipes 172 are coupled to cover 166.

FIG. 7 is a perspective view of base 202 shown in FIG. 6, according to one embodiment. FIG. 8 is a detail view of base 202 installed on heat producing component 108, according to one embodiment. Base 202 includes sections 204A, 204B, 204C, and 204D. Section 204A includes walls 152A forming microchannels 154A. Section 204B includes walls 152B forming microchannels 154B. Section 204C includes walls 152C forming microchannels 154C. Section 204D includes walls 152D forming microchannels 154D. Each of sections 204A, 204B, 204C, and 204D may have a different overall width and/or different microchannel dimensions than one or more of the other sections. For example, section 204B may be wider than sections 204A, 204C, or 204D.

Heat producing components (e.g., heat producing component 108) may produce different amounts of heat in different regions of the component. For example, semiconductor devices within a microprocessor package may be concentrated in one region of the package. In addition, some regions of a component may heat faster than others because of their location in the structure of the component. For example, for a given amount of power, the center of component 108 may heat faster than the edge of component 108 because the center is farther from any radiating surfaces (e.g., the sides) of the component. Moreover, the operating temperature of a region of a component may be affected by temporal factors. For example, semiconductor devices in one portion of a component may operate continuously, while semiconductor devices in another portion of the component may operate only intermittently.

In some embodiments, a multi channel cooling system may provide different cooling capacity for different regions of a component or group of components. The cooling capacity within a channel of a cooling system may be changed over time.

In some embodiments, section and microchannel dimensions of a cooling plate assembly are selected to provide more cooling in hotter regions of a heat producing component. For example, referring to FIG. 7, the region of heat producing component 108 corresponding to zones 206, 208, 210, 212, and 214 (e.g., the portion of heat producing component 108 directly below the circle), may each produce different amounts of heat. Zone 212 may correspond to the hottest region, for example. Zone 206 may correspond to the second hottest region. Zone 214, zone 210, and zone 208 may correspond to cooler regions. The width of microchannels 154A and 154C (which correspond to hotter zones 206 and zones 212, respectively) may be narrower than the width of microchannels 154B and 154D (which correspond to cooler zones 208, 210, and 214). In addition, the pitches of microchannels 154A and 154C may be finer (i.e., more microchannels per unit width) than the pitches of microchannels 154B and 154D. Narrower microchannels and/or a greater density of microchannels may increase cooling capacity of a section of a cooling device. Moreover, flow rates in one section of a device may be different than flow rates in other sections of the device. For example, the flow rate in section 204C may be regulated to be higher than that of the other sections to provide greater cooling capacity at hottest zone 212.

As shown in FIG. 7, sections may be parallel to one another. Sections may run substantially the full length of a cooling device. Nevertheless, other arrangements of sections may be suitable. For example, sections may be arranged in an N×M array, concentrically, or in an irregular pattern. An N-by-M array of cells may allow temperatures to be controlled in two dimensions (e.g., the x and y directions) on a heat producing component.

In one embodiment, a cooling device includes two or more cells. Each cell may be a different section of the cooling device. Each of the cells of a device may have one or more microchannel passages for cooling a region of a heat producing component.

As used herein, "cell" includes any chamber or hollow passage. Cells may have various shapes and sizes, including round, square, rectangular, ovate, or irregular. Each of cells of a device may provide a separate region for fluid cooling of a heat producing component coupled to the device. Cells may include temperature sensors or other devices for monitoring conditions in the cells.

Figure 9:
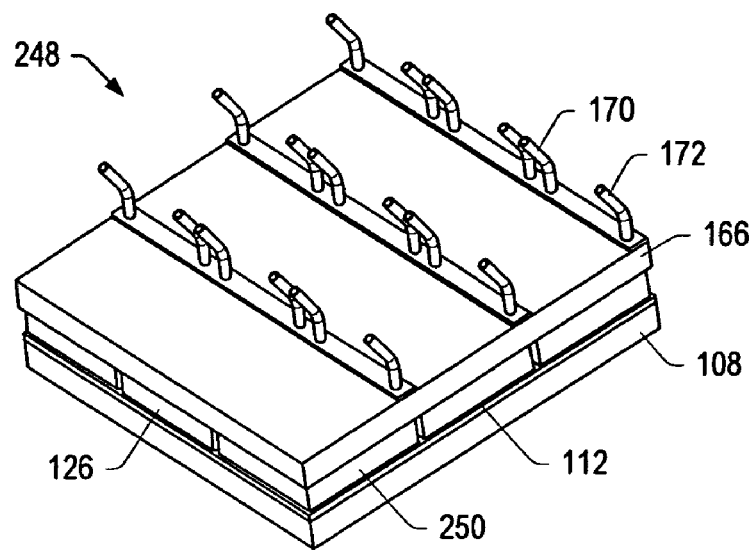
FIG. 9 depicts a cooling plate assembly including multiple cells according to one embodiment.
Figure 10:
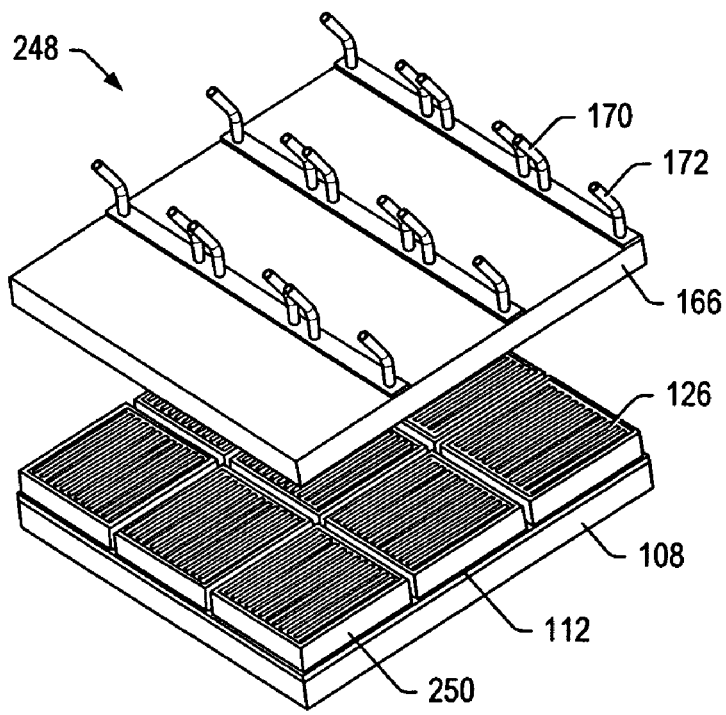
FIG. 10 depicts a cooling plate assembly including multiple cells with a cover removed according to one embodiment.
Figure 11:
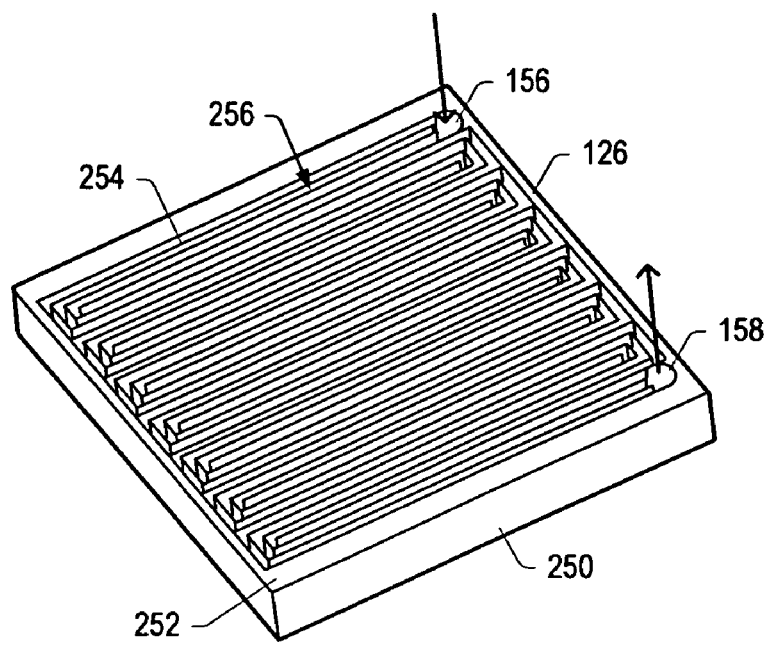
FIG. 11 depicts a cell including microchannel passages according to one embodiment.
Figure 12:
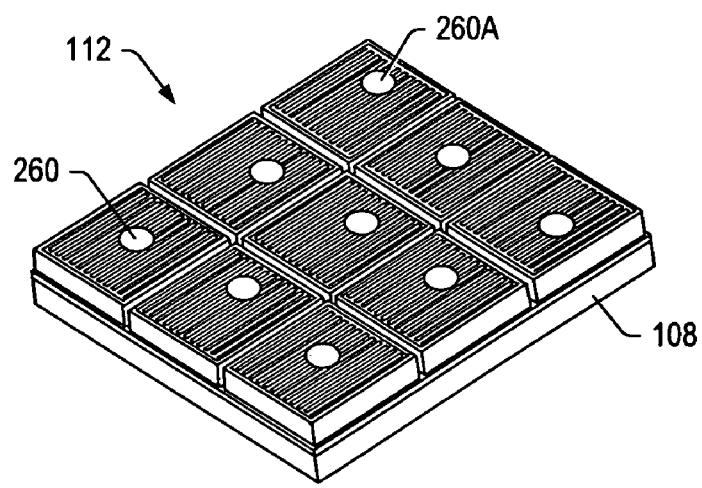
FIG. 12 depicts a base for a cooling device including multiple cells according to one embodiment.

FIGS. 9-10 depict a cooling plate assembly having an array of cells according to one embodiment. FIG. 11 depicts a base for a cooling plate assembly including a 3-by-3 array of cells according to one embodiment. FIG. 12 depicts microchannel passages in a cell according to one embodiment.

FIG. 9 depicts a cooling plate assembly with a cover fully installed on a base according to one embodiment. FIG. 10 depicts the cooling plate assembly of FIG. 9, with a cover removed to show cells of a base of the cooling plate assembly according to one embodiment. Cooling plate assembly 248 includes base 112 and cover 166. Base 112 is mounted on heat producing component 108. In some embodiments, base 112 is integral with heat producing component 108. For example, microchannels may be etched, micromachined, or electroformed in a top surface of a semiconductor package. Cover 166 couples with base 112 the upper face of cells 126. Cover 166 may enclose microchannels in cells 126. Inlet pipes 170 and outlet pipes 172 are attached to cover 166.

Referring to FIG. 11, cells 126 of base 112 may all have the same size and microchannel arrangement, or have different sizes and/or microchannel arrangements. Cell 126 is formed in cell block 250. Cell 126 includes inlet port 156 and outlet port 158. Cell block 250 includes exterior walls 252 and interior walls 254. Interior walls 254 define microchannel passages 256. Microchannel passages 256 create a continuous path 258 between inlet port 156 and outlet port 158. In the embodiment shown in FIG. 11, path 258 includes three parallel microchannel passages 256. In other embodiments, a path may include greater or fewer parallel microchannel passages, or a single microchannel passage.

Inlet ports 156 and outlet ports 158 may align with a corresponding inlet pipes 170 and outlet pipes 172, respectively, on cover 166. In the embodiment shown in FIG. 11, inlet port 156 and outlet port 158 are located near adjacent corners of cell 126. Inlet ports 156 and outlet ports 158 may be at different locations (e.g., relative to the lateral edges of a cell). In some embodiments, inlet ports and outlet ports may be located to increase cooling capacity of a cooling device. For example, an inlet port may be located so that fluid is introduced at or near the hottest spot of the heat producing component during operation of the component. In one embodiment, an inlet port is located at or near the center of the cell.

Although in the embodiments shown microchannels are integral to base 112, microchannels in other embodiments may be provided in a separate element that is attached to a base. In certain embodiments, microchannels may be provided on a cover instead of a base, or on both a cover and a base. In certain embodiments, microchannels may be formed in a package of a heat producing component (e.g., a microprocessor).

During operation of a cooling device, fluid in each of the cells can be regulated to provide different cooling capacities in different regions of heat producing component 108. For example, referring to FIG. 12, each of the zones 260 may correspond to a particular region on heat producing component 108. If, for example, zone 260A corresponds to a hot spot in heat producing component 108, a flow rate of fluid to the corresponding cell may be increased relative to that of the other cells.

Figure 13:
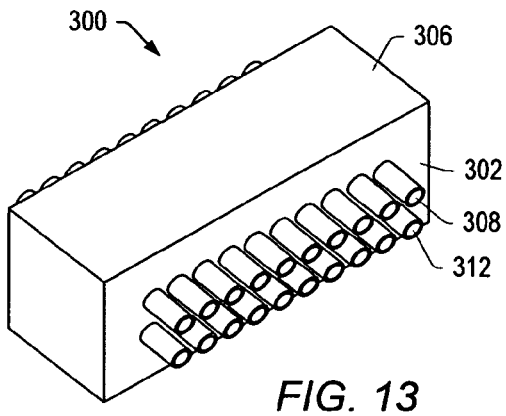
FIG. 13 depicts an MHD pump system according to one embodiment.
Figure 14:
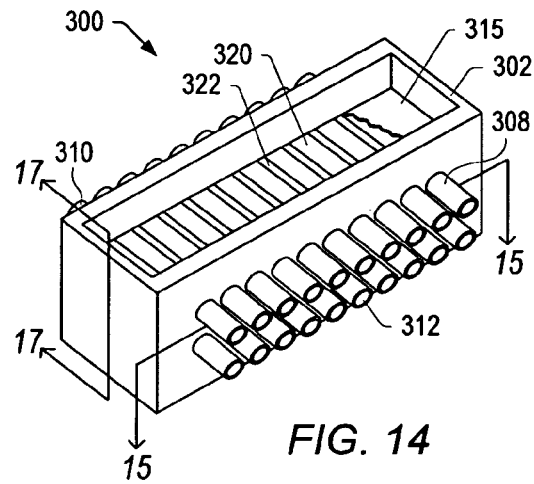
FIG. 14 depicts an MHD pump system with a cover removed according to one embodiment.
Figure 15:
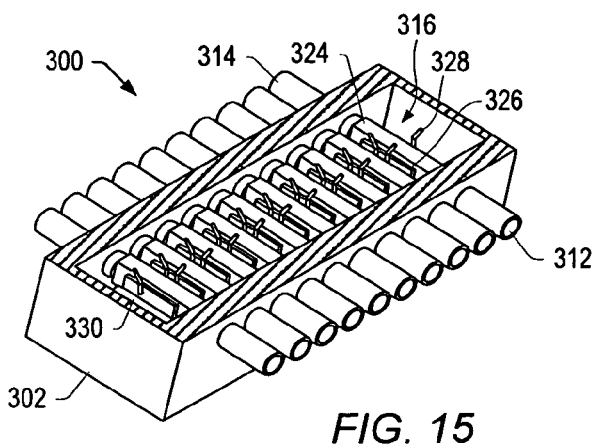
FIG. 15 is a cutaway view of a bottom portion of the MHD pump system shown in FIG. 14 taken substantially along lines 15-15 of FIG. 14.

FIGS. 13-15 depict a magnetohydrodynamic (MHD) pump system according to one embodiment. FIG. 13 is a perspective view of an MHD pump system. MHD pump system 300 includes yoke 302 and cover 306. Upper inlet tube 308, upper outlet tube 310, lower outlet tube 312, and lower inlet tube 314 (shown in FIG. 15) may pass through apertures in sides of yoke 302.

FIG. 14 depicts MHD pump system 300 shown in FIG. 13 with cover 306 removed according to one embodiment. Magnets 320 and spacers 322 are disposed in an alternating sequence in yoke 302. Magnets 320 may produce magnetic field for operating MHD pumps in MHD pump system 300. Magnets 320 may be attached on interior surfaces of yoke 302. In some embodiments, magnets 320 are permanent magnets. In other embodiments, magnets 320 may be electromagnets. In the embodiment shown in FIG. 14, yoke 302 includes interior plate 315. Interior plate 315 may provide attachment points for magnets 320 and/or spacers 322.

Yoke 302, cover 306, and/or interior plate 315 may be of a ferromagnetic material. Yoke 302, cover 306, and/or interior plate 315 may provide magnetic shielding for MHD pump system 300. For example, yoke 302, cover 306, and/or interior plate 315 may shield magnetic fields produced by magnets 320 and prevent magnetic leakage such that pump system operation does not adversely affect operation of electronic components of a system. Shielding elements of a system may be made of any suitable ferromagnetic material, such as a nickel-iron-cobalt material. Providing multiple pumps in one housing may provide a more compact multi-channel pump system than if a separate stand-alone pump were required for each channel. An array of magnets and pumps may provide magnetic fields that are stable and close-looped. Moreover, the demagnetization field may be designed to be relatively small.

In certain embodiments, upper magnets 320 and/or spacers 322 may be coupled to the sidewalls of yoke 302 by fasteners or adhesives. In still other embodiments, upper magnets 320 and/or spacers 322 may be held in channels, slots, pockets or grooves or on struts, rods, clips, or similar structural elements. In some embodiments, interior plate 315 is omitted.

FIG. 15 is a view of the lower portion of MHD pump system 300, sectioned along lines 15-15 of FIG. 14. One of MHD pumps 316 may be coupled between each of lower inlet tubes 314 and lower outlet tubes 312. MHD pump 316 may include pump tube segment 324, electrode 326, and leads 328. MHD pumps 316 may be operated to pump fluid from lower inlet tube 314 to lower outlet tube 312. It will be understood that MHD pumps 316 may be coupled between upper inlet tubes 308 and upper outlet tubes 310 in a similar arrangement to that shown in FIG. 15.

Lower magnets 330 are located below MHD pumps 316. Spacers 322 may separate lower magnets 330 from each other in a similar manner as shown in FIG. 14 for upper magnets 320. Lower magnets 330 and any associated spacers 336 (shown in FIG. 17) may be mounted in or to yoke 302 in the same manner as upper magnets 320.

Figure 16:
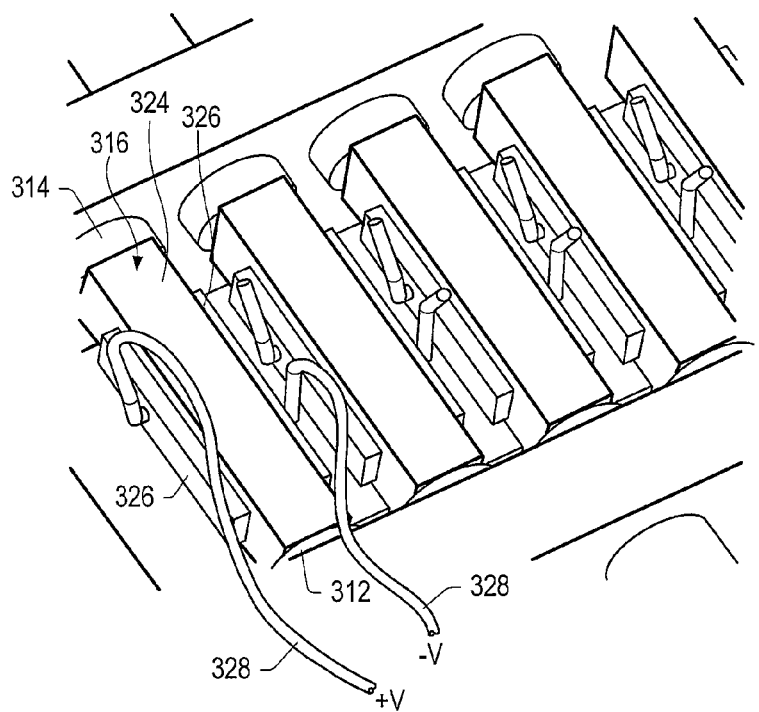
FIG. 16 depicts MHD pumps of an MHD pump system according to one embodiment.

FIG. 16 depicts a detail view of MHD pumps for MHD pump system 300 according to one embodiment. MHD pump 316 includes pump tube segment 324, electrodes 326, and leads 328. Electrodes 326 are coupled to pump tube segment 324. Leads 328 are coupled to electrodes 326. The interior sides of electrodes 326 may be exposed in pump passage 329. The ends of MHD pump 316 are coupled to lower inlet tube 314 and lower outlet tube 312. Pump tube segment 324 may be made of electrically non-conductive materials. Suitable materials may include ceramics and polymers. In certain embodiments, pairs of pump tube segments may be arranged concentrically (e.g., with an inside tube segment carrying fluid in one direction and an outside tube carrying fluid in the opposite direction).

Figure 16B:
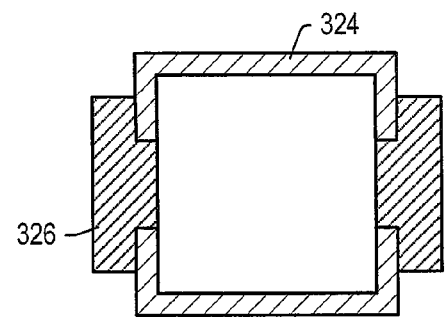
FIG. 16B depicts a cross section of an MHD pump system.
Figure 16A:
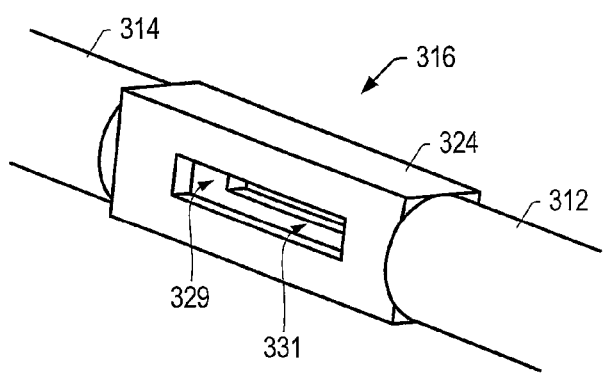
FIG. 16A depicts an MHD pump with electrodes removed according to one embodiment.

FIG. 16A depicts a detail view of MHD pumps 316 shown in FIG. 16, with electrodes 326 and leads 328 removed for clarity, according to one embodiment. Pump tube segment 324 includes pump passage 329 and apertures 331. Pump passage 329 may be a through passage. Pump passage 329 may be in fluid communication with passages in lower inlet tube 314 and lower outlet tube 312. Apertures 331 may receive electrodes 326.

FIG. 16B depicts a cross section of the MHD pump system shown in FIG. 16, including pump tube segment 324 and electrodes 326.

Figure 17:
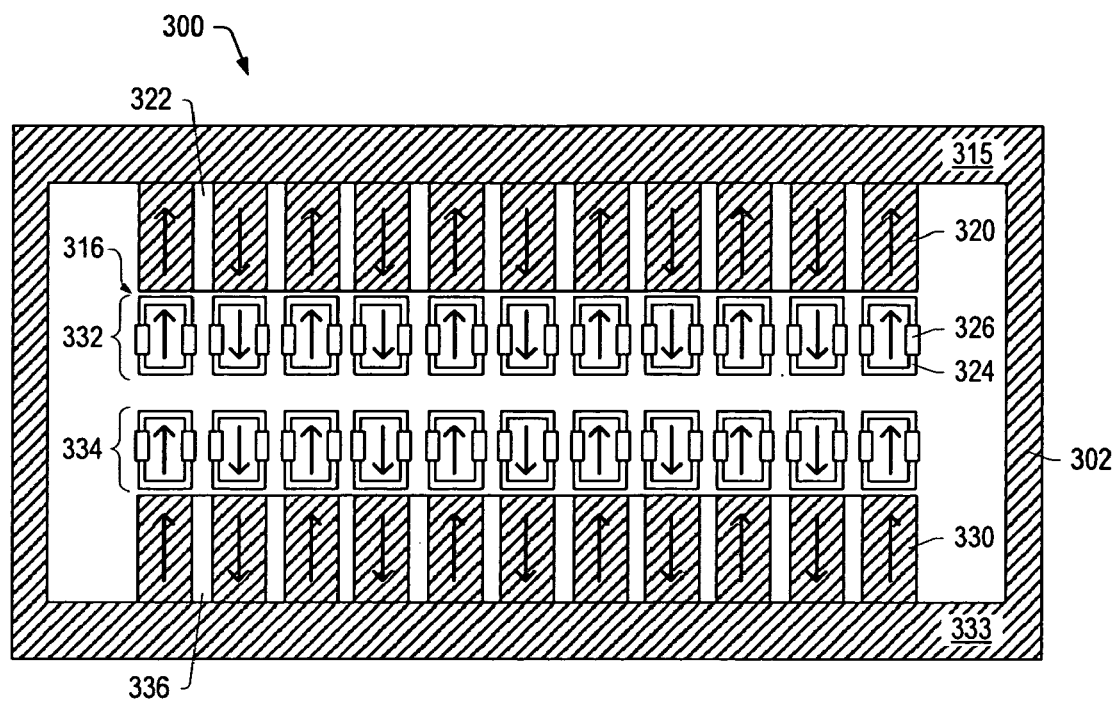
FIG. 17 is a cutaway view of the MHD pump system shown in FIG. 14 taken substantially along lines 17-17 of FIG. 14.

FIG. 17 is a cross sectional view of MHD pump system 300 according to one embodiment. Upper magnets 320 and spacers 322 are coupled in an alternating pattern under interior plate 315. Lower magnets 330 and spacer 336 are coupled in an alternating pattern over interior plate 333. Upper row 332 of MHD pumps 316 may be coupled between upper inlet tubes 308 and upper outlet tubes 310 that pass through apertures in yoke 302 (as shown in FIG. 13). Upper row 332 of MHD pumps 316 may be located below upper magnets 320. Lower row 334 of MHD pumps 318 may be coupled between lower inlet tubes 314 and lower outlet tubes 312 (as shown in FIG. 15). Lower row 334 of MHD pumps 316 may be located above lower magnets 330.

In the embodiment shown in FIG. 17, there is one magnet corresponding to each of the MHD pumps 316. Nevertheless in some embodiments, magnets may be arranged in different patterns or combinations than those shown in FIG. 17. For example, there may be more than one magnet for one or more of MHD pumps 316. As another example, two or more MHD pumps may operate using the magnetic field produced by a single magnet. It will be understood that a particular MHD pump may be affected by magnetic fields produced by magnets that are adjacent to other MHD pumps. For example, upper magnets 320 may produce fields in MHD pumps 316 in lower row 334.

The arrows on each of the various elements (e.g., pumps 316, upper magnets 320, and lower magnets 322) indicate a magnetization direction associated with the element produced by one or more magnets 320 and 330. In the embodiment shown in FIG. 17, the magnetization direction alternates with each successive column from left to right. Thus, the leftmost upper magnet 320 and lower magnet 330 are oriented in the same direction and have an upward magnetization direction. The leftmost MHD pumps 316 in upper row 332 and lower row 334 have an upward magnetization. The next upper magnet 320 and lower magnet 330 in the column to the right of the leftmost column are oriented in the same direction as one another, but have a downward magnetization direction.

Figure 18:
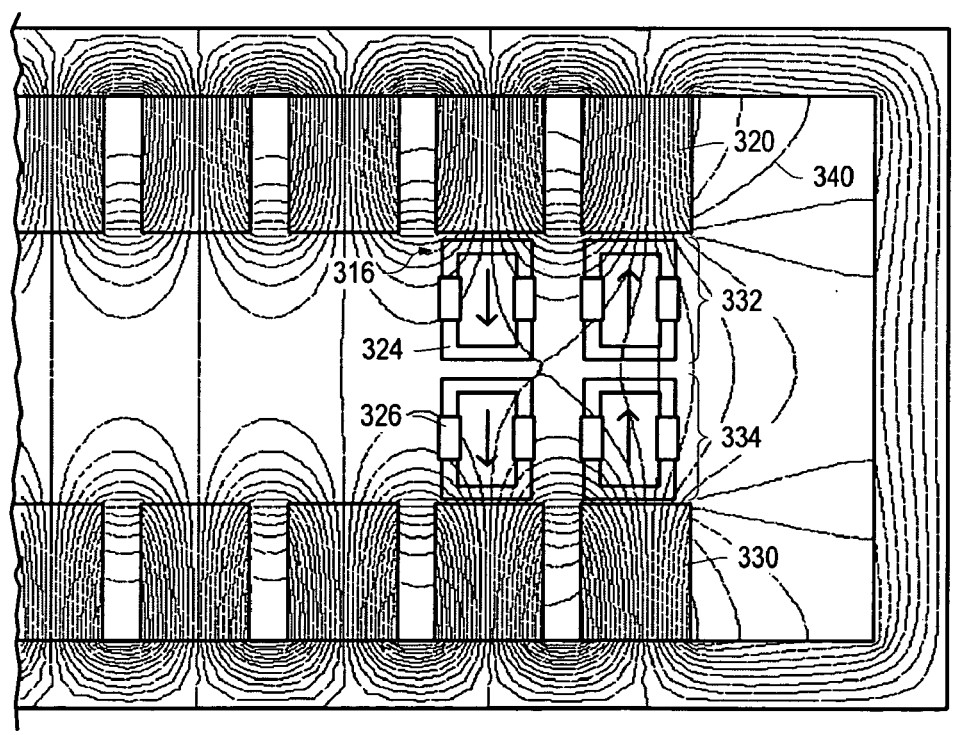
FIG. 18 depicts magnetic flux lines of a two-row pump system according to one embodiment.

The corresponding MHD pumps 316 in upper row 332 and lower row 334 also have a downward magnetization. FIG. 18 depicts flux lines 340 of a magnetic field produced by upper magnets 320 and lower magnets 330 according to one embodiment. Although in the embodiments shown in FIGS. 17 and 18, the magnets are arranged in an alternating column format, it will be understood that, in other embodiments, other arrangements may be used in an MHD pump system. For example, magnets within a single column may be polarized (e.g., N-S) in opposite directions. As another example, adjacent magnets in a given row may be polarized in the same direction.

Figure 19:
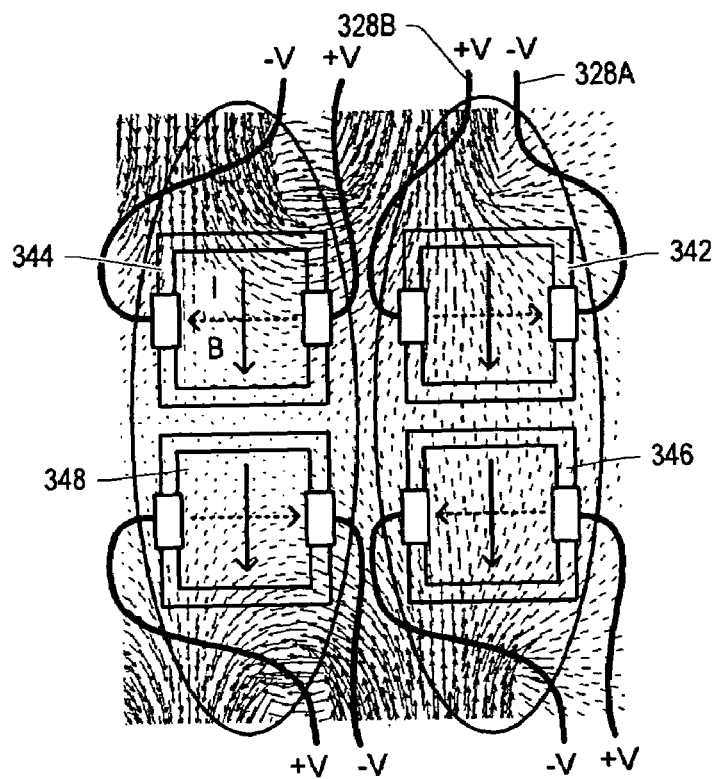
FIG. 19 is a detail view of MHD pumps according to one embodiment.

FIG. 19 depicts MHD pumps 342, 344, 346, and 348 in MHD pump system 300 according to one embodiment. Each of MHD pumps 342, 344, 346, and 348 has positive lead 328A and negative lead 328B. Positive lead 328A and negative lead 328B may be coupled to a controller (e.g., controller 104 shown in FIG. 1). Controller may apply a voltage across fluid in each of MHD pumps 342, 344, 346, and 348 by way of electrodes 326. The voltage across the fluid 328 may produce electrical current I in fluid. According to Lorentz law, current I in magnetic field B may produce flow of fluid "into the page" or "out of the page". The flow of the fluid depends on the direction of current I in relation to magnetic field B. For example, in the embodiment shown in FIG. 19, the positive lead is on the right for MHD pumps 344 and 346 and on the left for MHD pumps 342 and 348. Based on this arrangement, fluid flow in MHD pump 342 and MHD pump 348 may be into the page and fluid flow in MHD pump 344 and MHD pump 346 may be out of the page. Thus, each column in MHD pump system 300 shown in FIG. 19 may have a pair of pumps, with one pump operating in one direction and another pump operating in the opposite direction (e.g., 344 and 348, or 342 and 346).

Figure 20:
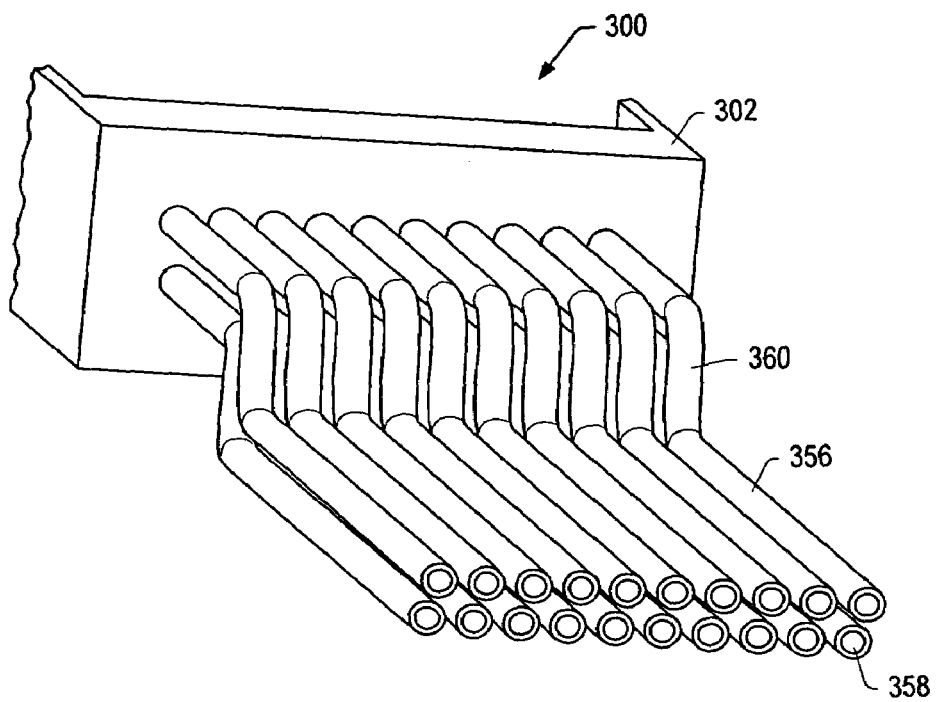
FIG. 20 depicts inlet and outlet pipes of an MHD pump system according to one embodiment.

FIG. 20 depicts a routing of pipes from a pump system according to one embodiment. Upper pipes 356 and lower pipes 358 are coupled to yoke 302 of pump system 300. Upper pipes 356 may variously carry fluid to or away from the pump system. Lower pipes 358 may variously carry fluid to or away from the pump system. In one embodiment, each column of two pipes (e.g., one upper and one lower pipe) includes one supply pipe and one return pipe. Pipes may be coupled to other components of a cooling device by various methods such as soldering, brazing, or epoxy.

Upper pipes 356 and lower pipes 358 include bends 360. Bends 360 may allow pipes to be aligned with one or more cooling plate assemblies, reservoirs, or other elements of a cooling system. Bend 360 may allow a longitudinal axis of pipes 358 and 360 to be substantially parallel to a plane of a circuit board (e.g., circuit board 110 in FIG. 1). In other embodiments, pipes may have no bend. For example, pipes of a cooling device may extend perpendicular to a circuit board over the entire length of the pipes. In still other embodiments, pipes of a heat transfer device may include bends at various angles other than 90 degrees. In certain embodiments, pipes may extend in different directions from one another. For example, pipes in a three by three array may include bends such that the three of the pipes extend in one direction, while the other six pipes of the array include bends to extend in direction opposite the three pipes. Distributing different pipes or groups of pipes in different directions may promote rejection of heat from the pipes (e.g., by exposing more surface area of the pipes to the surroundings).

Although the embodiment shown in FIGS. 13-15 depict a 2 by 11 array of pumps, many other arrangements of pumps may be suitable. In some embodiments, pumps and their associated inlet and outlet tubing may be staggered (e.g., vertically and/or horizontally) with respect to one another, aligned with one another, or a combination thereof. A pump system may have only a single row of pumps, or more than two rows of pumps.

Figure 21:
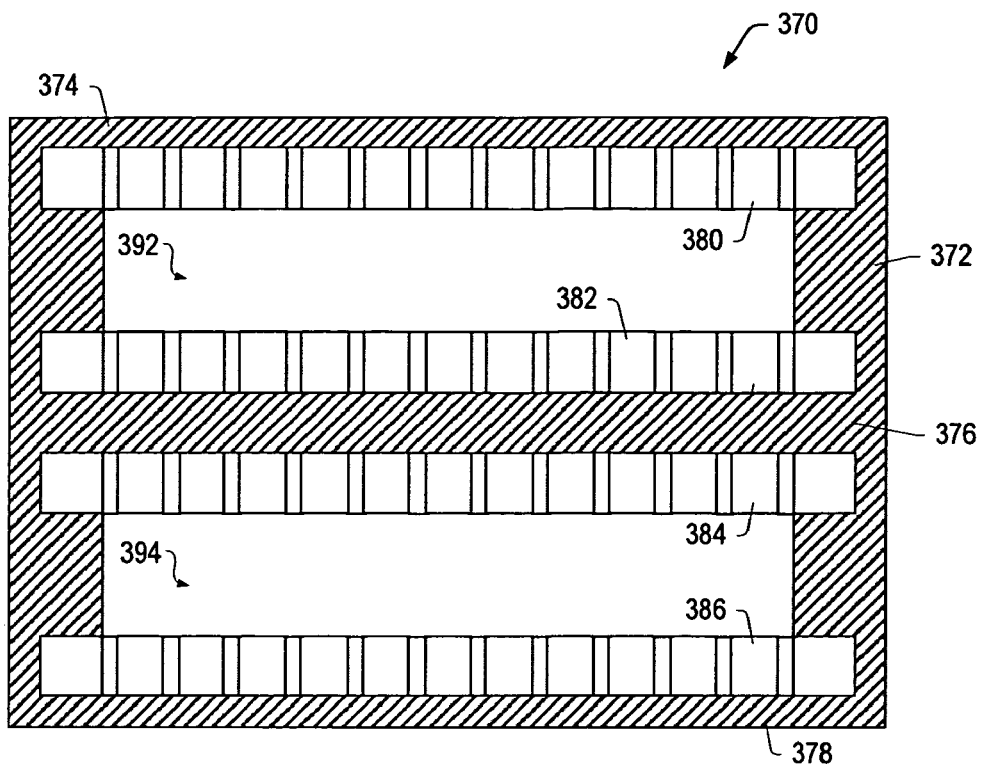
FIG. 21 is a schematic diagram of a pump system including four rows of magnets according to one embodiment.
Figure 22:
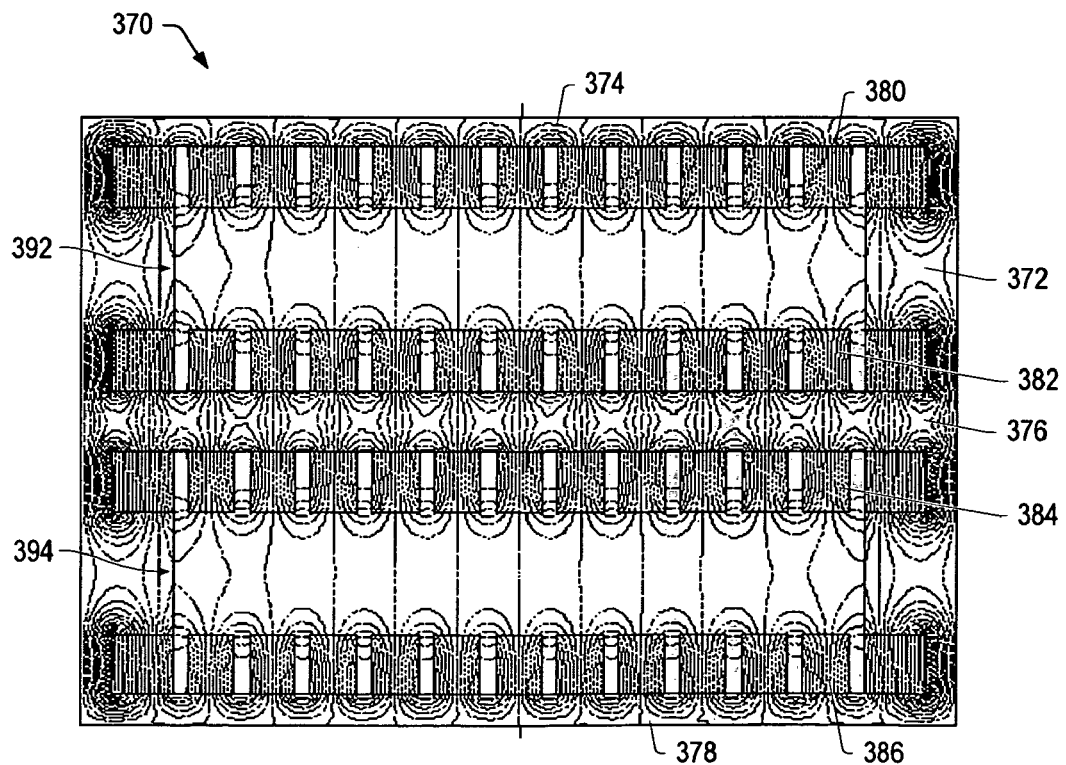
FIG. 22 depicts magnetic flux lines of a pump system including four rows of magnets according to one embodiment.

FIG. 21 depicts a schematic diagram of an MHD pump system including four rows of magnets. MHD pump system 370 includes yoke 372. Yoke 372 includes upper rail 374, middle rail 376, and lower rail 378. MHD pump system 370 includes magnet rows 380, 382, 384, and 386. Magnets in row 380 may be coupled to upper rail 374. Magnets in magnet rows 382 and 384 may be coupled to middle rail 376. Magnet row 386 may be coupled to lower rail 378. An upper stack of pumps (e.g., a column having two pumps) may be positioned in upper cavity 392 between each opposing pair of magnets in rows 380 and 382. A lower stack of pumps (e.g., a column having two pumps) may be positioned in lower cavity 394 in between each opposing pair of magnets in rows 384 and 386. FIG. 22 depicts flux lines of a magnetic field for the embodiment shown in FIG. 21 produced by magnets in magnet rows 380, 382, 384, and 386 according to one embodiment.

In one embodiment, all the magnets in an MHD pump system may be identical. Nevertheless, in some embodiments different magnets in a MHD pump system may be different sizes, shapes, and construction and/or have different magnetic characteristics. For example, all the magnets in magnet rows 380 and 382 may be one size, while all the magnets in magnet rows 384 and 386 may be a different size. Different size magnets may allow for different pumping capacity in different channels of a cooling device.

Temperatures sensors (e.g., temperature sensors 138 as shown in FIG. 1) may be located in various locations of a cooling device. In one embodiment, temperature sensors are embedded in a base of the cooling device. Temperature sensors 138 may in certain embodiments be placed in other locations, such as on or near a heat producing component 108, or on or near a circuit board 110. In certain embodiments, temperatures may be located on a microchannel cover (e.g., cover 166). Suitable temperature sensors may include thermocouples, thermistors, resistance temperature devices (RTDs), infrared radiation sensors, bimetallic devices, and change-of-state sensors. In one embodiment, temperatures sensors include at least one thermal diode on a heat producing component (e.g., a silicon chip). In another embodiment, ring-oscillator temperature sensors may be deployed across the surface of a heat producing component.

In some embodiments, a temperature sensor may adjoin multiple sections (e.g., multiple cells). For example, in the embodiment shown in FIG. 11, temperature sensors may be located in each corner of the center cell, thereby adjoining the cells around the center cell. Temperature sensors that adjoin multiple cells may be used to provide thermal data for use in monitoring cooling in all the adjoining cells. Leads may connect temperature sensors to systems for monitoring performance and controlling fluid systems in a cooling device (e.g., controller 104). In certain embodiments, non-temperature sensors such as flow rate sensors or pressure sensors may be included in a cooling device.

Heat sinks for a cooling device (e.g., heat sink 116 shown in FIG. 1) may be of various size, shape, and construction. In some embodiments, a heat sink includes fins with channels formed between the channels. In certain embodiments, air or another fluid may be forced through channels to promote cooling of the pipes. In certain embodiments, a heat sink may include a heat exchanger. The heat exchanger may reject heat from one or more cooling device circuits (e.g., channels shown in FIG. 1) to fluid in another circuit. In one embodiment, a heat sink includes or is coupled to a heat pipe. In certain embodiments, pipes of a cooling device (e.g., pipes 114 shown in FIG. 1) may be coupled to other elements to promote cooling of the pipes, such as folded fins, radial fins, or pins. Pipes, heat sink, and other heat dissipating elements of a cooling system may be made of thermally conductive materials, such as copper or aluminum. In certain embodiments, fluid in a cooling circuit may undergo a phase change (e.g., evaporation and condensation) during operation.

Pump 316 may pump an electrically conductive, thermally conductive liquid through pump passage 329. Suitable liquids for a cooling system may include gallium-based low melting point alloys such as Indalloy® alloys, made by Indium Corporation of America. To operate pump 316, voltage may be applied across the pair of electrodes 326. Electrical current may flow from left to right in pump passage 329. Magnets may create magnetic field B in the location of pump passage 329. Based on the Lorentz force law, a force is applied to the cooling liquid in pump passage 329. The force may cause fluid to flow in pump passage 329. The flow rate is a function of the voltage applied across electrodes 326.

As discussed above, a cooling system may use feedback from temperature sensors on a cooling device to regulate cooling. In one embodiment, a controller provisions a cooling liquid to one or more regions of a component in proportion to thermal flux of the regions.

Referring again to FIG. 1, during operation of cooling system, controller 104 may receive temperature data from temperature sensors. In one embodiment, a controller receives continuous digitized telemetry signals measured at multiple locations across a chip and dynamic CPU load metrics. In some embodiments, a controller monitors heat flux (e.g., dynamic heat flux) for one or more components and sub-components. In certain embodiments, heat flux for components or sub-components is inferred from other measurements, such as temperature. In some embodiments, telemetry metrics for a controller may include one or more temperature measurements and/or other variables such as currents, voltages, measured or inferred heat flux, or CPU utilization metrics. In some embodiments, temperature, heat flux, and/or other data may be used in designing cooling channels and other flow and configuration parameters.

Controller 104 may be a separate component of a system or integrated into other elements of a system. For example, a server may include software to enable a microprocessor to control a cooling device (e.g., processing temperature data and/or heat flux data and/or regulating pumps), as well as perform primary functions of the server such as network communications, business transactions, etc. A system may include telemetry harness software to deliver input to controller 104 (e.g., a MIMO controller). Temperature sensors 138 may measure thermal conditions on or near heat producing component 108.

Controller 104 may regulate a flow rate of each of pumps 132 and 134 separately by controlling the voltage across the electrodes of each pump 132 or 134. In some embodiments, controller 104 applies a different voltage to each pump 132 or 134 such that each cooling channel 216 operates at a different flow rate. For example, if channel 124A cools a hotter region of component 108 than channel 124, pump 132A and 134A may be operated at a higher flow rate than pump 124B. In some embodiments, controller 104 controls the flow rates in channels 124 dynamically during operation of cooling system 100. Controller 104 may use information from temperature sensors 138 to determine the appropriate operating parameters for each channel 124. For example, as temperature sensors for channel 124A indicate an increase in temperature near cell 126A, the operating voltage for pump 132A and 134A may be increased, thereby increasing the flow rate in channel 224. In some embodiments, controller 104 is used to reduce thermal gradients in heat producing component 108. Reducing thermal gradients in an electronic component such as a microprocessor may improve long-term reliability of the component.

In an embodiment, active cooling (e.g., using a multi-channel controller) is combined with passive cooling. For example, the active system described above may be combined with a heat pipe. As another example, some systems may control the flow rates in some channels dynamically using temperature feedback, while allowing other channels pump at a predetermined rate (e.g., wherein a fixed voltage is applied to the channel pumps).

For each channel 124, controller 104 may use data from more than one temperature sensor 138. Using temperature data from multiple data sensors for a cell may provide more accurate measurement of conditions over the surface of a heat producing component, thereby increasing cooling effectiveness of the cooling system. In one embodiment, a controller may use data from temperature sensors in a particular cell and in one or more of the nearest neighboring cells.

In some embodiments, different channels of a cooling device may have different construction and/or operating characteristics. Examples of such characteristics include the size of the supply and/or return passages, the size of a pump for a channel, the length of a pipe, and the location of the pipe relative to external cooling air. In certain embodiments, pipes for different passages may be arranged to increase the cooling effectiveness of a particular channel. Arranging pipes of a multichannel cooling device to promote heat rejection for the hotter channels of a cooling device may help reduce thermal gradients in a heat producing component, thereby increasing the reliability of the system.

Although the embodiment of a cooling device described in FIGS. 9-12 includes a three by three arrangement of cells, a heat transfer device may in other embodiments include other arrangements. A heat transfer device may provide any number and arrangement of cells. For example, in another embodiment, a heat transfer device may include two or more cells in an inline arrangement. In addition, a pipe may provide in certain embodiments supply and remove cooling liquid from more than one cell. Similarly, a single pump may pump cooling liquid for more than one cell.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims. For example, a pump system may be coupled to a base by direct attachment or by way of pipes between the pump system and the base. When the terms "front," "rear," "vertical," "horizontal" "upward", "downward," "under", "over," "left," or "right" are used in the claims, they are to be understood to relate to the Figures as illustrated. However, the device may be turned at an angle to the horizontal or inverted with the quoted terms referring to the altered orientation. As used herein, the word "may" is used in a permissive sense (i.e., meaning having the potential to), rather than the mandatory sense (i.e., meaning must). Similarly, the words "include", "including", and "includes" mean including, but not limited to.

What is claimed is:

1. A cooling system for a heat producing component, comprising:
    a base comprising a plurality of microchannel cells, at least two of the cells having one or more microchannel passages therein, the base being configured to couple to an electronic device, wherein the plurality of microchannel cells is arranged in an N-by-M array such that temperatures are controllable in two dimensions on the heat producing component; and at least one magnetohydrodynamic pump configured to provision fluid to at least one of the microchannel passages, wherein the at least one magnetohydrodynamic pump comprises one or more pairs of magnetohydrodynamic pumps, wherein each of the one or more pairs of magnetohydrodynamic pumps is arranged to pump fluid in series and configured to pump fluid in one of the microchannel cells, wherein at least one of the one or more pairs of magnetohydrodynamic pumps comprises a first magnetohydrodynamic pump and a second magnetohydrodynamic pump in a common enclosure, wherein the first magnetohydrodynamic pump is configured to pump fluid through the common enclosure in a first direction and the second magnetohydrodynamic pump is configured to pump fluid from the first magnetohydrodynamic pump through the common enclosure in a direction opposite to the first direction.

2. The cooling system of claim 1, further comprising a shielding member, wherein the magnetohydrodynamic pumps are arranged in an array, wherein the array is at least partially surrounded by the shielding member.

3. The cooling system of claim 1, further comprising a controller coupled to two or more of the magnetohydrodynamic pumps, wherein the controller is configured to control a flow rate through at least one of the pumps independently of at least one other of the pumps.

4. The cooling system of claim 3, wherein the controller is configured to control a fluid flow rate of at least one of the cells independently of one or more of the other cells.

5. The cooling system of claim 1, wherein at least one of the magnetohydrodynamic pumps comprises:
  an electrically non-conductive tube segment comprising a pump passage;
  a pair of electrodes, each electrode passing through a wall of the tube segment; and
  one or more magnets configured to produce a magnetic field in the pump passage.

6. The cooling system of claim 1, wherein the one or more pairs of magnetohydrodynamic pumps comprise two or more pairs of magnetohydrodynamic pumps, wherein the two or more pairs of magnetohydrodynamic pumps are in the common enclosure, wherein each of at least two of the two or more pairs of magnetohydrodynamic pumps comprises a first magnetohydrodynamic pump configured to pump fluid through the common enclosure in the first direction and a second pump configured to pump fluid from the first magnetohydrodynamic pump of the pair through the common enclosure in the direction opposite to the first direction.

7. A cooling system for a heat producing component, comprising:
  a base comprising a plurality of microchannel cells, at least two of the cells having one or more microchannel passages therein, the base being configured to couple to an electronic device, wherein the plurality of microchannel cells is arranged in an N-by-M array such that temperatures are controllable in two dimensions on the heat producing component; and
  at least one magnetohydrodynamic pump configured to provision fluid to at least one of the microchannel passages, wherein the at least one magnetohydrodynamic pump comprises a plurality of magnetohydrodynamic pumps in a common enclosure, wherein at least two of the magnetohydrodynamic pumps in the common housing share at least one magnet.

8. The cooling system of claim 7, further comprising a shielding member, wherein the plurality of magnetohydrodynamic pumps is arranged in an array, wherein the array is at least partially surrounded by the shielding member.

9. The cooling system of claim 7, further comprising a controller coupled to one or more of the magnetohydrodynamic pumps, wherein the controller is configured to control a flow rate through at least one of the pumps independently of at least one other of the pumps.

10. The cooling system of claim 9, wherein the controller is configured to control a fluid flow rate of at least one of the cells independently of one or more of the other cells.

11. The cooling system of claim 7, wherein at least one of the magnetohydrodynamic pumps comprises:
  an electrically non-conductive tube segment comprising a pump passage;
  a pair of electrodes, each electrode passing through a wall of the tube segment; and
  one or more magnets configured to produce a magnetic field in the pump passage.

12. A cooling system for a heat producing component, comprising:
  a base comprising a plurality of microchannel cells, at least two of the cells having one or more microchannel passages therein, the base being configured to couple to an electronic device, wherein the plurality of microchannel cells is arranged in an N-by-M array such that temperatures are controllable in two dimensions on the heat producing component; and
  at least one magnetohydrodynamic pump configured to provision fluid to at least one of the microchannel passages, wherein the at least one magnetohydrodynamic pump comprises an array of magnetohydrodynamic pumps in a common housing, wherein each of the magnetohydrodynamic pumps comprises a pair of electrodes, wherein the positive and negative leads in the pairs of electrodes are arranged in an alternating pattern from pump to pump such that the flow direction of the fluid in the magnetohydrodynamic pumps alternates from pump to pump.

13. The cooling system of claim 12, further comprising a shielding member, wherein the array of magnetohydrodynamic pumps are at least partially surrounded by the shielding member.

14. The cooling system of claim 12, further comprising a controller coupled to one or more of the magnetohydrodynamic pumps, wherein the controller is configured to control a flow rate through at least one of the pumps independently of at least one other of the pumps.

15. The cooling system of claim 14, wherein the controller is configured to control a fluid flow rate of at least one of the cells independently of one or more of the other cells.

16. The cooling system of claim 12, wherein at least one of the magnetohydrodynamic pumps comprises:
  an electrically non-conductive tube segment comprising a pump passage;
  a pair of electrodes, each electrode passing through a wall of the tube segment; and
  one or more magnets configured to produce a magnetic field in the pump passage.

* * * * *